United States Patent [19]

Knoedler et al.

[11] Patent Number: 4,759,821
[45] Date of Patent: Jul. 26, 1988

[54] PROCESS FOR PREPARING A VERTICALLY DIFFERENTIATED TRANSISTOR DEVICE

[75] Inventors: Christina M. Knoedler, Peekskill, N.Y.; Douglas C. LaTulipe, Jr., Danbury, Conn.

[73] Assignee: International Business Machines Corporation, Armonk, N.Y.

[21] Appl. No.: 897,891

[22] Filed: Aug. 19, 1986

[51] Int. Cl.$^4$ .................. H01L 21/306; C23F 1/00
[52] U.S. Cl. ..................... 156/643; 156/640; 156/652; 156/656; 156/665
[58] Field of Search ............. 156/643, 656, 665, 640, 156/652

[56] References Cited

U.S. PATENT DOCUMENTS

| | | | |
|---|---|---|---|
| 4,454,014 | 6/1984 | Bischoff | 156/652 |
| 4,482,442 | 11/1984 | Kohl et al. | 204/129.3 |
| 4,528,066 | 7/1985 | Merkling, Jr. et al. | 156/643 |
| 4,529,475 | 7/1985 | Okano et al. | 156/643 |
| 4,572,765 | 2/1986 | Berry | 156/653 |

FOREIGN PATENT DOCUMENTS 57-73180  5/1982  Japan.
58-132933  8/1983  Japan.

Primary Examiner—Kenneth M. Schor
Assistant Examiner—Lori-Ann Cody
Attorney, Agent, or Firm—Scully, Scott, Murphy & Presser

[57] ABSTRACT

A process for the fabrication of a vertically differentiated semiconductor structure is disclosed. In this process the semiconductor structure is covered with a vertical erosion control mask. The control mask covering at least one horizontal surface of the semiconductor structure is removed leaving the vertical surface covering intact. An isotropic etching of the uncovered horizontal surface next occurs. Finally, the control mask covering of the vertical surface of the semiconductor structure is removed. This process permits etching treatment of horizontal surface defects without adverse effect on the vertical surface of the semiconductor structure.

13 Claims, 2 Drawing Sheets

PROCESS FOR PREPARING A VERTICALLY DIFFERENTIATED TRANSISTOR DEVICE

BACKGROUND OF THE INVENTION

1. Field of the Invention

The present invention is directed to a process for fabricating a vertically differentiated transistor device. more specifically, the present invention is directed to a process for protecting the gate structure of a vertically differentiated transistor structure during erosion operations.

2. Background of the Prior Art

The tremendous growth of the semiconductor industry has resulted in improved processes for fabricating vertically differentiated transistor devices. A problem associated with this fabrication has been the poor surface morphology that oftentimes results after vertically differentiated transistors are defined by reactive ion etching, typically in a halogen based plasma. A typical manifestation of this phenomenon is the "grass" which remains atop the insulating surface of a III-V compound, typically aluminum gallium arsenide, vertically differentiated semiconductor structure.

Up to now the surface of a vertically differentiated transistor device having poor surface morphology was subjected to a plasma etch in a halogen atmosphere. Although this procedure is successful in removing the grass, thus improving surface morphology, this method has been found to be unsatisfactory because while the horizontal surface subject to etching improves, the vertical surface of the gate is also etched resulting in surface damage thereto. This effect renders the transistor unusable.

The problem of undercutting in photoelectrochemical etching of transistor devices has been a problem long known in the art. Several methods have been advanced for coping with this problem. That is, several processes have been advanced for providing anisotropic etching of a vertically differentiated semiconductor structure without concurrent lateral etching which has the adverse effects discussed above.

One such method is set forth in U.S. Pat. No. 4,529,475. In that patent a dry etching apparatus and method is disclosed in which anisotropic etching is said to be achieved without causing surface damage to a workpiece subject to selective etching. This is accomplished by etching in a vacuum chamber in which two feedstock gases are introduced. One of the gases contributes to the etching effect while the other gas forms a film on the side wall of the etched portion of the workpiece protecting that wall from lateral etching. Although this method is recited to be successful, the problem of removing the film thus formed remains. The protecting film is very difficult to remove.

Another method advanced in the art is set forth in U.S. Pat. No. 4,528,066. The process of the '066 patent involves a reactive ion etching technique for etching a gate electrode comprising layers of tungsten silicide and polycrystalline silicon without etching the underlying layer of silicon dioxide which serves as the gate dielectric covering the source and drain regions. The invention of the '066 patent involves coating the gate with polytetrafluoroethylene to protect the side walls of the gate from excessive etching in the lateral direction while etching continues at the bottom on either side of the gate. Again, although this method is recited to be successful, the removal of the polytetrafluoroethylene coating is very difficult.

A third development in this art is incorporated in U.S. Pat. No. 4,482,442. The '442 patent discloses a process for photoelectrochemically etching n-type gallium arsenide and closely related gallium aluminum arsenide and gallium aluminum phosphide compound semiconductors. In this method the area to be etched is radiated while the semiconductor is in contact with an aqueous electrolyte solution containing an oxidizing and a solvating agent which dissolves the product of the oxidation process. The use of an oxidizing agent ensures oxidation in the presence of light without excessive oxidation in the absence thereof. Thus, anisotropic etching occurs with minimal etching of non-illuminated areas. The side of the semiconductor wafer is therefore non-illuminated thus minimizing lateral etching. This method requires special etching apparatus, increasing the complexity of the photoelectrochemical procedure.

Other semiconductor producing processes, which offer processes for protecting vertical faces of semiconductor structures during dry plasma etching, are set forth in Japanese Patent Publication Nos. 57-73180 and 58-132933. Suffice it to say, these methods if employed with the semiconductor structures treated in accordance with the present invention would cover horizontal surfaces and therefore would not improve the poor surface morphology of the horizontal surface of the semiconductor device. This is to be expected in that these disclosures are directed to distinguished silicon semiconductor devices rather than the III-V compound type semiconductors of the present invention.

The above remarks establish the need in the art for a new process for fabricating vertically differentiated semiconductor structures wherein lateral etching is effectively controlled without applying coatings which are difficult to remove to effectuate this desirable result. It is furthermore apparent that the process should not require modification of the apparatus usually utilized in semiconductor operations.

SUMMARY OF THE INVENTION

A process has now been discovered wherein lateral etching, often described as lateral erosion progression of a vertical surface, of a vertically differentiated transistor structure is substantially eliminated. This process occurs without the concomitant establishment of sidewall films which are not easily removed. Moreover, the process occurs in an etching chamber which is not modified from the design utilized in the procedures of the prior art for anisotropic dry etching of semiconductor devices.

In accordance with the present invention, a process is provided for the fabrication of a vertically differentiated semiconductor structure. The process comprises covering a vertically differentiated semiconductor structure having horizontal and vertical surfaces with a vertical erosion control mask. The horizontal surface covered by the control mask is next removed. This is followed by an erosion operation of the uncovered horizontal surface. The process is completed by removal of the control mask covering the vertical surface of the semiconductor structure.

BRIEF DESCRIPTION OF THE DRAWINGS

The instant invention may be better understood with reference to the accompanying drawings of which.

DETAILED DESCRIPTION

The present invention is directed to a process for improving the surface morphology of a vertically differentiated device. More particularly, the semiconductor device to which the process of the present invention may be applied is a field effect transistor or a heterojunction bipolar transistor device. Such transistor devices include a gate or emitter which controls the flow of electrons across the transistor heterojunction, that is, the gate (emitter) controls electrical current that flows through the transistor device.

A particularly preferred class of transistor devices within the contemplation of the present invention are the so-called III-V compound semiconductors. As those skilled in the art are aware, gallium arsenide/aluminum gallium arsenide semiconductors represent the most commercially developed of this class of semiconductors. Other preferred III-V compound semiconductors within the contemplation of the process of this invention include aluminum arsenide, indium arsenide, aluminum antimonide, gallium antimonide, indium antimonide and the like.

Because a gallium arsenide/aluminum gallium arsenide semiconductor is the most preferred embodiment of the semiconductors within the contemplation of the present invention, the description of the process of the present invention will be described with reference to such a semiconductor device. It should be appreciated, however, that all III-V compound semiconductors are processed in accordance with the procedure provided below for gallium arsenide semiconductor devices.

Figure 1:
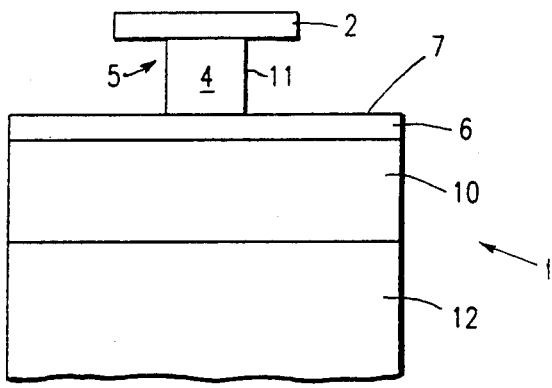
FIG. 1 is a schematic representation of a desired vertically differentiated semiconductor structure.

FIG. 1 illustrates a desired vertically differentiated gallium arsenide semiconductor 1. The semiconductor device 1 may be either a field effect transistor or a heterojunction bipolar transistor. Such a device is characterized by the presence of a gate 5 which includes a metal contact 2, which, in a preferred embodiment, is a refractory metal, and a doped crystal of gallium arsenide. A refractory metal particularly preferred for use in one embodiment of the present invention is molybdenumgermanium. The horizontal surface 7 of the device 1 is covered with an insulating layer 6, which in the case of a gallium arsenide semiconductor is aluminum gallium arsenide. An undoped gallium arsenide crystal of gallium arsenide 10 is disposed beneath the layer 6, below which is the gallium arsenide substrate crystal 12.

Figure 2:
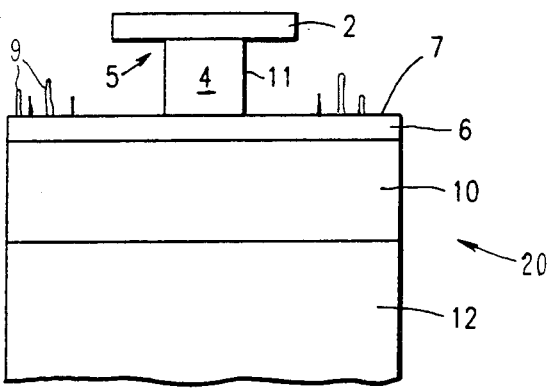
FIG. 2 is a schematic representation of a vertically differentiated semiconductor structure characterized by poor surface morphology.

Unfortunately, oftentimes the desired device is not produced in conventional forming processes. Typically, during the conventional anisotropic dry etching step of the transistor forming operation at least one horizontal face is subject to deleterious surface effects. This is illustrated in FIG. 2. A gallium arsenide semiconductor device denoted at 20 is characterized by poor surface morphology at the horizontal surface 7 of the aluminum gallium arsenide covering 6. This is manifested by "grass," depicted at 9. This grass 9 is tiny whiskers of gallium arsenide. These whiskers have the effect of rendering the device 20 unusable. In order to produce the desired device 1 of FIG. 1 the grass 9 must be removed without adversely effecting other surfaces of the semiconductor device 20.

It is known in the prior art that anisotropic dry etching, i.e., reactive ion etching or reactive ion beam etching, effectively removes grass 9. However, this treatment also results in lateral etching of the doped gallium arsenide. Specifically, the vertical surface 11 of the doped gallium arsenide crystal 4 of gate 5 is subject to deleterious etching. Again, etching of the surface 11 can render the device 20 inoperable.

To overcome this problem, consistent with the removal of grass 9, a process has been developed, the first step of which involves the covering of the device 20 with a control mask. Preferably, this control mask is a photoresist, known to those skilled in the transistor art as being resistant to the etching effect of an anisotropic dry etching procedure. The result of this step on device 20 is illustrated in FIG. 3 wherein the photoresist is depicted at 13.

Figure 3:
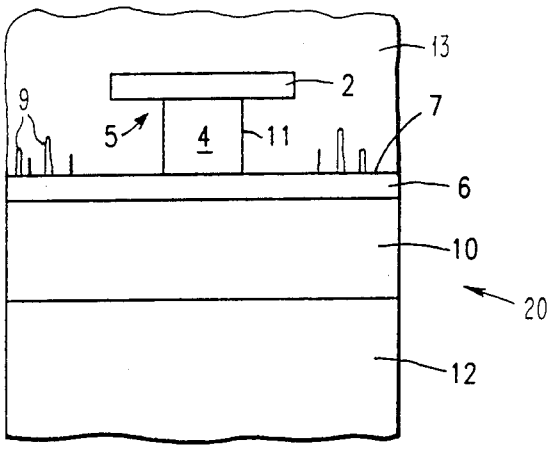
FIG. 3 is a schematic representation of the semiconductor of FIG. 2 provided with an erosion mask.

As shown in FIG. 3, the photoresist covers the entire horizontal surface 7 as well as the gate 5. However, the above remarks make it obvious that the aim is to etch the surface 7 without etching the vulnerable surfaces of the gate 5, the lateral surface 11 of the doped gallium arsenide crystal 4. Thus, in order to effectuate this desired result the photoresist must be removed from surface 7, prior to etching, without being removed from surface 11. This result is uniquely possible when the semiconductor structure is a field effect or heterojunction bipolar transistor or any other such device which is provided with a "T" shaped gate.

As those skilled in the art are aware, a positive photoresist is removable by exposure to ultraviolet rays. Thus, in the process of the present invention, the photoresist pattern 13, is defined 7 by exposure to vertically incident ultraviolet rays and subsequent development. Because of the "T" shape of the gate 5 the vertically incident ultraviolet rays applied perpendicular to surface 7 do not effect photoresist 13 disposed on surface 11 since the ultraviolet rays are shielded by the overhang of the metal contact 2. Therefore, the photoresist 13 remains disposed over surface 11 of doped gallium arsenide crystal 4.

Figure 4:
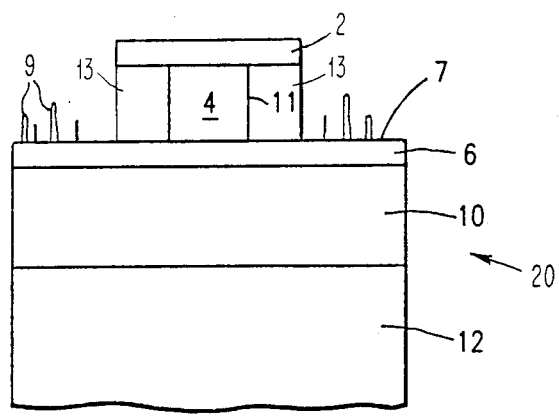
FIG. 4 is a schematic representation of the semiconductor of FIG. 3 after removal of the erosion mask from the horizontal surface of said semiconductor.
Figure 5:
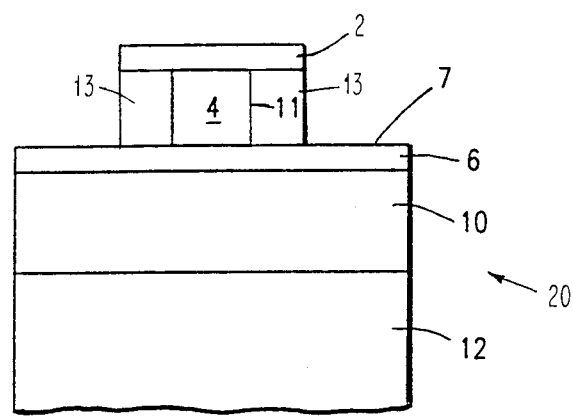
FIG. 5 is a schematic representation of the semiconductor of FIG. 4, after an erosion operation.

This result of photoresist removal from at least one horizontal surface of the transistor device is shown in FIG. 4. In FIG. 4, the device 20 is illustrated as it appears after the ultraviolet exposure and development steps. A coating of photoresist 13 covers the vertical surface 11 of the doped gallium arsenide crystal 4 but does not cover horizontal surface 7.

The transistor device 20 is now in condition for removal of the grass 9, still present on the surface 7 of the aluminum gallium arsenide covering 6. To this end, the device is exposed to conventional isotropic dry etching, usually a plasma of a halogen, preferably chlorine. The conditions of the isotropic dry etching does not effect the aluminum gallium arsenide surface. Dry etching has the effect of removing grass 9 resulting in significant improvement in surface morphology of the horizontal surface 7. At the same time, because surface 11 is covered with photoresist 13, no etching of this surface occurs. FIG. 4 graphically depicts the result obtained after device 20 is subjected to dry etching.

Unlike the processes of the prior art, the final step in the process of the present invention, the removal of the control mask from surfaces subject to lateral etching, is relatively simple. Those skilled in the art are aware that photoresist is easily dissolvable in common organic solvents. Preferably, acetone or N-methyl pyrrolidone is employed as the organic solvent with acetone being particularly preferred. Of course, semiconductor materials of the transistor devices preferred for use in the present invention, the III-V compound semiconductors, are insoluble in the organic solvents used to remove photoresist 13. Thus, the treatment of device 20 with the organic solvent used in the process of the present invention results in the formation of the desired device 1, as illustrated in FIG. 1. This solvent treatment represents the final step in the process.

The above description will make apparent, to those skilled in the art, embodiments and examples of the invention described herein. These embodiments and examples are within the contemplation of the present invention. Therefore, the present invention should be limited only by the appended claims.

What is claimed is:

1. A process for the fabrication of a vertically differentiated semiconductor structure comprising:
   providing a vertically differentiated semiconductor structure including an horizontal surface layer disposed over a substrate and a gate comprising a doped crystal disposed over a portion of said horizontal surface, said doped crystal provided with vertical surfaces, and a contact disposed atop said doped crystal said contact and said doped crystal being arranged in a T-shape, with said contact forming the horizontal member of said T;
   covering said vertically differentiated semiconductor structure with a photoresist control mask;
   removing said photoresist control mask covering from the portion of said horizontal surface layer which is not disposed beneath the horizontal member of the T;
   conducting an isotropic etching operation on said uncovered horizontal surface layer; and
   removing said photoresist control mask from said vertical surfaces of said doped crystal.

2. A process in accordance with claim 1 wherein said photoresist control mask is removed from said portion of said horizontal surface by exposure to vertically incident ultraviolet rays and development.

3. A process in accordance with claim 1 wherein said photoresist control mask is removed from said vertical surfaces of said doped crystal by an organic solvent in which said doped crystal is insoluble.

4. A process in accordance with claim 3 wherein said solvent is selected from the group consisting of acetone and N-methyl pyrrolidone.

5. A process in accordance with claim 4 wherein said solvent is acetone.

6. A process in accordance with claim 1 wherein said semiconductor structure is a field effect transistor device.

7. A process in accordance with claim 1 wherein said semiconductor structure is a heterojunction bipolar transistor device.

8. A process in accordance with claim 1 wherein said vertically differentiated semiconductor structure is a III-V compound semiconductor device.

9. A process in accordance with claim 8 wherein said III-V compound semiconductor is a gallium arsenide/aluminum gallium arsenide semiconductor device.

10. A process in accordance with claim 9 wherein said unetchable horizontal surface layer is aluminum gallium arsenide.

11. A process for the fabrication of a gallium arsenide vertically differentiated semiconductor structure comprising:
    providing a gallium arsenide vertically differentiated semiconductor structure including an aluminum gallium arsenide horizontal surface layer disposed over a gallium arsenide substrate and a gate comprising a doped gallium arsenide crystal disposed over a portion of said aluminum gallium arsenide horizontal layer, said doped gallium arsenide crystal provided with vertical surfaces, and a contact disposed atop said doped crystal; said contact and said doped crystal being arranged in a T-shape, with said contact forming the horizontal member of said T
    covering said gallium arsenide vertically differentiated semiconductor structure with a photoresist control mask;
    exposing said gallium arsenide vertically differentiated semiconductor structure to vertically incident ultraviolet rays and developing whereby said photoresist control mask is removed from the portion of said aluminum arsenide horizontal surface layer; which is not disposed beneath the horizontal member of the T
    dry etching said uncovered aluminum gallium arsenide horizontal surface layer; and
    dissolving said photoresist control mask from said vertical surfaces of said doped gallium arsenide crystal.

12. A process in accordance with claim 11 wherein said step of dissolving said photoresist control mask is effected by immersion of said photoresist, covering said vertical surfaces of said doped gallium arsenide crystal, in an organic solvent.

13. A process in accordance with claim 11 wherein said solvent is acetone.

* * * * *